United States Patent
Upton et al.

(10) Patent No.: US 7,274,737 B2
(45) Date of Patent: Sep. 25, 2007

(54) EHF EQUALIZER IMPLEMENTED WITH MEMS TAP WEIGHT CONTROLS

(75) Inventors: Eric L. Upton, Bellevue, WA (US); James M. Anderson, Huntington Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 841 days.

(21) Appl. No.: 10/285,158

(22) Filed: Oct. 31, 2002

(65) Prior Publication Data

US 2004/0086035 A1 May 6, 2004

(51) Int. Cl.
*H03H 7/30* (2006.01)
*H03H 7/40* (2006.01)
*H03H 5/159* (2006.01)

(52) U.S. Cl. .................. 375/232; 375/229; 375/234
(58) Field of Classification Search ........ 375/229–236; 333/18
See application file for complete search history.

(56) References Cited

U.S. PATENT DOCUMENTS

| | | | |
|---|---|---|---|
| 5,325,322 A | 6/1994 | Bailey et al. | |
| 6,150,901 A * | 11/2000 | Auken | 333/174 |
| 6,167,024 A | 12/2000 | Upton et al. | |
| 6,348,846 B1 * | 2/2002 | Von Gutfeld et al. | 333/201 |
| 6,469,493 B1 * | 10/2002 | Muething, Jr. et al. | 324/158.1 |
| 6,711,216 B2 * | 3/2004 | Hannah | 375/296 |
| 6,711,317 B2 * | 3/2004 | Jin et al. | 385/18 |
| 6,888,983 B2 * | 5/2005 | Gustafson et al. | 385/33 |

* cited by examiner

*Primary Examiner*—Jay K. Patel
*Assistant Examiner*—Curtis B. Odom
(74) *Attorney, Agent, or Firm*—John A. Miller; Miller IP Group, PLC (57) ABSTRACT

A signal equalizer that employs micro-electromechanical machine devices for the tap weight controllers. The equalizer includes a substrate on which is formed a forward transmission line rail and a return transmission line rail. A cantilever stanchion is also formed on the substrate that runs parallel with the transmission line rails. A series of spaced apart cantilevers are pivotally mounted to the cantilever stanchion, and extend over the transmission line rails to define a gap therebetween. A weight tap line is coupled to each cantilever, and is responsive to a DC weight signal that controls the position of the cantilever to set the gap between the cantilever and the transmission line rails. A distorted signal is coupled from the forward transmission line rail to the return transmission line rail through the cantilevers.

23 Claims, 5 Drawing Sheets

EHF EQUALIZER IMPLEMENTED WITH MEMS TAP WEIGHT CONTROLS

BACKGROUND OF THE INVENTION

1. Field of the Invention

This invention relates generally to an equalizer for correcting distortions in a communications signal and, more particularly, to a feed forward equalizer (FFE) processor and/or a decision feedback equalizer (DFE) processor for correcting a distorted waveform in a fiber optical communications system, where the FFE processor and the DFE processor employ micro-electromechanical (MEM) devices for the tap weight controls in the processors.

2. Discussion of the Related Art

Modern high speed digital communications systems transmitting very high data rates, 10-40 Gbps, typically transmit optical signals carrying digital data down a fiber optic cable to transfer the data. The fiber optic cable includes a waveguide core having one index of refraction that is surrounded by a cladding layer having another, lower, index of refraction. Optical signals propagating down the core at a certain angle of incidence are reflected off of the core/cladding transition to be contained therein.

The optical signals propagating through the fiber optic cable are distorted by the waveguide medium. This distortion may cause loss of data when the optical signal is demodulated at the receiver to remove the information therefrom. Optical distortion typically comes from two sources, chromatic dispersion and polarization modulation dispersion. Polarization modulation dispersion occurs because the light in the optical signal having one polarization orientation travels faster than the light in the signal at other polarization orientations. In other words, regardless of whether the polarization of the signal is circular, elliptical, linear, etc., the axis of the polarization rotates so that when the signal is oriented along one particular axis it will travel faster than when it is oriented along another axis.

Chromatic dispersion is related to the frequency of the optical signal, where chromatic dispersion increases the farther the signal propagates and the wider the signal bandwidth. Further, light at higher frequencies propagates faster than light at lower frequencies. Chromatic dispersion occurs because as the optical signal propagates through the fiber optic cable and is reflected off of the transition between the core and cladding layer, some parts of the signal have a different path length than other parts of the signal and thus travel a different distance. Because the optical signal may travel through the fiber cable several thousand miles between a transmitter and a receiver, the distortion may be significant.

Both chromatic dispersion and polarization dispersion cause the digital coded bits in the signal to be at different places (forward or backward) in the signal than would be expected, thus affecting the ability to recover the bits in the receiver. Particularly, some of the several parts of a bit may be included in the symbol of a previous or next symbol. Thus, the distortion affects the reliability of decoding the bits to remove the information. Because the distortion is linear, the process that distorted the signal can be inverted to provide a corrected signal.

It is known in the art to employ equalizers in the receiver of a fiber optic communications systems for reconstructing the corrupted signal before it is decoded to correct for distortions caused by chromatic and polarization dispersion. Generally, the equalizer restores the waveform of the signal by inversion of the transform of the distortions caused by the fiber optic cable. The equalizer defines a transform that is the inverse of the distortion process caused by the fiber cable. Equalizers known in the art include a finite impulse response (FIR) equalizer, sometimes called a feed forward equalizer (FFE) processor, and an infinite impulse response (IIR) equalizer, sometimes called a decision feedback equalizer (DFE) processor when a decision circuit is employed. The DFE processor is different than the FFE processor because it employs a feedback loop. However, as is understood in the art, FFE processors and DFE processors have different advantages and drawbacks.

The optical signal is converted to an RF analog signal prior to being applied to the equalizer. For very high frequency applications, the wavelength of the signal is short enough that it easily fits on small integrated circuit chips. The equalizer samples the RF analog signal at spatial locations along the signal waveform. The signal is multiplied by a weight value applied to a tap at each sample location to provide the distortion correction. Each weighted signal is summed with the weighted signals from the other sample locations. Thus, the distortions in the signal are corrected through the dot product of the signal and weight vectors.

The equalizers known in the art are effective for correcting signal distortions in optical communications systems. However, as the processor speeds and data rate speeds increase, it becomes increasingly more difficult to sample the signals by the known techniques to provide the signal reconstruction because the electronic elements, such as analog-to-digital converters, multipliers, summers, etc., would need to be too large, require too much power and would be unable to operate fast enough. For example, to correct a 40 Gbps signal, the signal would need to be sampled at the Nyquist sampling rate or greater, which could be about 120 giga-samples per second. At this data rate, the sampled signal would have to be delayed, multiplied and summed in each sample stage of the equalizer in about 8.3 picoseconds which is currently unattainable. Thus, it is necessary to provide different techniques than are currently known to sample and weight the distorted signals in an equalizer with state of the art techniques.

SUMMARY OF THE INVENTION

In accordance with the teachings of the present invention, a feed forward equalizer processor or a decision feedback equalizer processor is disclosed that employs micro-electromechanical devices for the tap weight controls in the processor. The processor includes a substrate on which is formed a forward transmission line rail and a return transmission line rail that provide the signal delay. A cantilever stanchion rail is also formed on the substrate parallel with the transmission line rails. A series of spaced apart cantilevers are mounted at one end to the cantilever stanchion rail so that they extend over the transmission line rails to define a gap therebetween. A weight tap line is coupled to each cantilever. The tap line is responsive to a DC weight signal that causes the cantilever to flex to control the position of the cantilever and set the gap between the cantilever and the transmission line rails.

A distorted signal propagating down the forward rail is coupled into each cantilever, and from the cantilever is then coupled into the return rail. The gap determines how much of the signal is coupled into and from the cantilever. Thus, the return rail sums the coupled signals at each cantilever. In one embodiment, the distorted signal is a differential signal, where both positive and negative forward and return transmission line rails are provided for both the positive and negative parts of the differential signal.

Additional objects, advantages and features of the present invention will become apparent from the following description and appended claims, taken in conjunction with the accompanying drawings.

DETAILED DESCRIPTION OF THE EMBODIMENTS

The following discussion of the invention directed to an equalizer employing micro-electromechanical devices for weight tap controls is merely exemplary in nature, and is in no way intended to limit the invention or its applications or uses.

Figure 1:
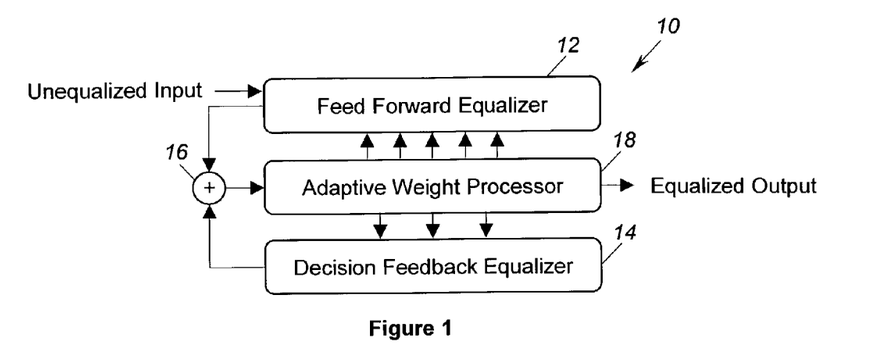
FIG. 1 is a block diagram of an equalizer for correcting wave distortions in a signal, where the equalizer includes an adaptive weight processor, according to an embodiment of the present invention.

FIG. 1 is a general block diagram of an equalizer 10, according to an embodiment of the present invention, employing an FFE processor 12 and a DFE processor 14. The FFE processor 12 receives a distorted RF signal. In one embodiment, the RF signal is a converted optical signal in an optical communications system. The processors 12 and 14 sample the signal at predetermined spatial tap locations to provide a measure of the signal and a correction of the distortion in the signal based on a processor transform. The sampled signal from the processors 12 and 14 are applied to a summer 16 that sums the sampled and weighted signal from the processor 12 with the sampled and weighted signal from the processor 14. The summed signal is applied to an adaptive weight processor 18 that provides weight values to control taps at the spatial sample locations in the processors 12 and 14 to correct the distortion in the signal. Thus, by providing the weight values to the taps along the signal path in both the processors 12 and 14, the distortion in the RF signal can be corrected to provide an equalized output signal from the processor 18. The operation of DFE and FFE processors for this purpose is well understood to those skilled in the art.

Figure 2:
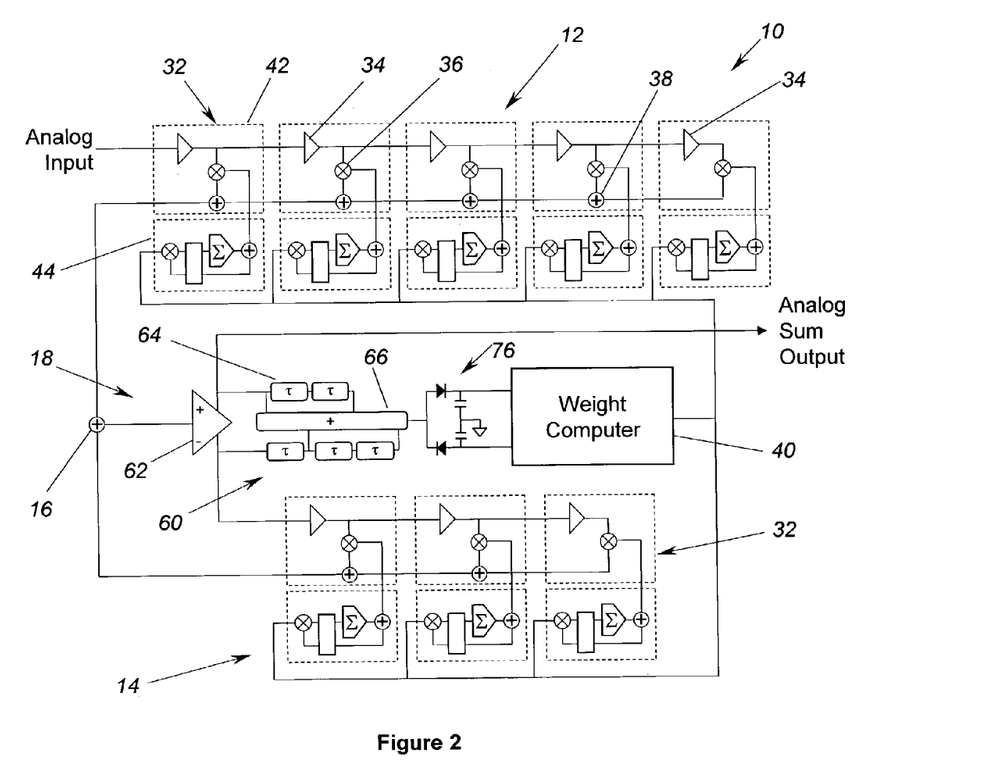
FIG. 2 is a schematic block diagram of the equalizer shown in FIG. 1 where the adaptive weight processor includes a correlative error detection system, according to an embodiment of the present invention.

FIG. 2 is a schematic block diagram of the equalizer 10. The FFE processor 12 and the DFE processor 14 include a plurality of stages 32 that spatially sample and weight the analog input signal, as will be discussed in more detail below. The consecutive stages 32 allow the sampling to be performed spatially as the signal propagates through the processors 12 and 14. The stages 32 are separated by a predetermined distance to provide a tapped delay line, where the distance between the stages is a tightly controlled delta t. Only one of the stages 32 will be discussed herein with the understanding that the other stages 32 operate in the same manner. The particular operation of each stage 32 and how it applies a weight value to the signal is well understood to those skilled in the art. In this example, the FFE processor 12 includes five stages 32 and the DFE processor 14 includes three stages 32. However, this is by way of a non-limiting example in that other FFE and DFE processors may employ other numbers of stages.

Each stage 32 includes a weighting junction 42 and a coding system 44. The input signal to the processor 12 or 14 is applied to an isolation amplifier 34 in the weighting junction 42. The amplified input signal is applied to the next stage 32 and to a multiplier 36 in the current stage 32. The multiplier 36 multiplies the signal by a weight value from the coding system 44 to convolve the signal with the weight value. The coding system 44 generates a unique coded weight value received from a weight computer 40. The weight computer 40, discussed in more detail below, employs any one of several known algorithms to generate the weight values in response to detected or measured distortions in the input signal.

In one embodiment, the coding system 44 employs code division multiple access (CDMA) so that each stage 32 is defined by a unique code. A CDMA system of this type for this environment is disclosed in U.S. Pat. No. 6,167,024, assigned to the assignee of this application, and herein incorporated by reference. Each of the coding systems 44 allow the weight signals to be multiplexed through the several stages 32. The specific application of using the weighting junctions 42 and the coding systems 44 is by way of example in that other types of FFE and DFE implementations can be employed within the scope of the present invention.

The signal applied to the multiplier 36 from the coding system 44 is the tap weight value for the stage 32. The multiplied signal from the multiplier 36 is then applied to a summer 38 that is summed with the multiplied signal from all of the following stages 32. Thus, each stage 32 provides a sample of the signal at a spatial location, where all of the signals from the stages 32 are summed. According to convention, each weighted signal from all of the weighting junctions 42 are summed by the following equation:

$$\sum_{t=1}^{m} s(t) \cdot w(t) \tag{1}$$

where s(t) is the input signal at a particular tap, w(t) is the weight value that is multiplied by the signal at that tap and m is the number of stages 32. The weighted signals from the FFE processor 12 and the DFE processor 14 are applied to the summer 16 that combines the signals in the manner that is known in the art.

Eye chart analysis, known to those skilled in the art, is used to determine whether the optical signal waveform is transmitting a one bit or a zero bit at a particular point in time. An "open eye" state allows a threshold to be used to determine whether the magnitude of the waveform identifies a one or a zero bit. As the eye closes, it becomes more difficult to reliably identify the bit. Therefore, error detection devices are employed in equalizers to insure that the signal has a certain magnitude when a one bit is detected and a certain magnitude when a zero bit is detected. The adaptive weight processor 18 continually adjusts the weight values applied to the junctions 42 to keep the eye open.

In known equalizers, a voltage comparator operating as a regenerative high gain amplifier generally detected the error. Because the data rates are so high and the voltages are so small in state of the art communications system, the decision time to determine whether an error exists is very small, possibly on the order of 6 picoseconds, and has a sensitivity on the order of 1% full scale. Therefore, the known technique of error detection is not effective.

Figure 3:
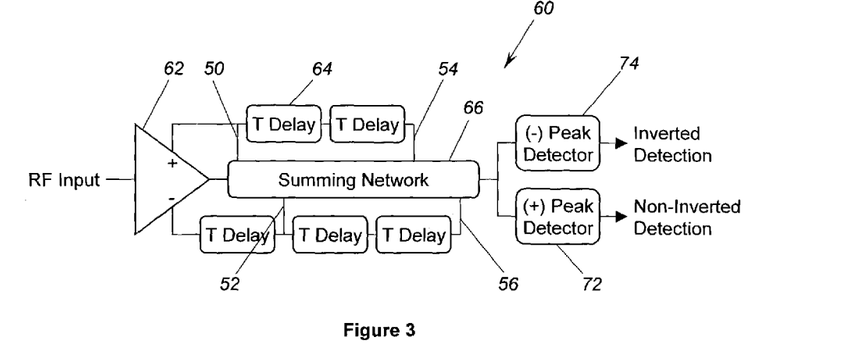
FIG. 3 is a schematic diagram of the correlative error detection system removed from the equalizer shown in FIG. 2.

According to the invention, a correlative error detection process is performed to set the weight value applied to each of the weighting junctions 42 to minimize the distortion in the input signal. FIG. 3 is a block diagram of a correlative error detection system 60, according to the invention, separated from the equalizer 10. The error detection system 60 provides error detection at very high data rates, using minimal power, with the desired accuracy and within a very small time window. Generally, the system 60 looks for a random series of bits (symbol), and provides a correlative signal peak when the series of bits is detected. Thus, the system 60 operates as a sliding window correlator. For example, the system 60 may be programmed to provide the correlative signal peak if a 1010 bit stream is detected at a predetermined time. Because the bit sequence is four bits in length, the 1010 sequence will occur on average once every sixteen times ($2^n$) in a random data stream. By adjusting the weight values applied to the tap junctions 42, the peaks will modulate in amplitude. Thus, the error detection system 60 operates as a discriminator to identify when the waveform of the predetermined series of bits has the desired shape (open eye).

To perform the above described auto-correlation process, it is necessary to convert the bit symbol to a numerical value suitable for arithmetic functions. For example, the bit sequence 1010 is converted to 1, −1, 1, −1 and represents the condition for the ideal weight values for the equalizer 10. This sequence of correlation values can be changed in length and number in other embodiments, however, four values provides good amplitude resolution above the distortion floor and good transitions between values. Further, the four value sequence provides a processing gain of 6 dB in voltage. In the convolving process, points in the signal are multiplied by each weight value and then added together. Thus, a maximum signal output (peak) occurs when the points in the corrected signal match the desirable weight value sequence. The operation of the system 60 thus acts as a matched filter.

The signal from the summer 16 is applied to a differential amplifier 62 that splits the signal into itself and its compliment. The negative part of the signal is the input to the DFE processor 14, although, in alternate embodiments, the positive part of the signal can be used for the input to the DFE processor 14. Splitting the signal in this manner reduces the hardware downstream. Both the signal and the compliment of the signal are applied to a series of delay devices 64 that delay the signal for a predetermined period of time. The signal and its compliment are tapped four times, once for each of the four correlation values (1, −1, 1, −1). Particularly, a first tap 50 taps the signal directly from the amplifier 62, a second tap 52 taps the compliment of the signal after it has been delayed by one delay device 64, a third tap 54 taps the signal after it has been delayed by two delay devices 64 and a fourth tap 56 taps the compliment of the signal after it has been delayed by three delay devices 64. Thus, a partial correlation of the signal is provided every delay period. The delay devices 64 could allow the signal to be correlation processed at four separate locations in the signal at the same time.

The tapped signals are applied to a summing network 66 that sums the tapped signals to provide the summation portion of a dot product for the correlation process. When the signal components match the sequence of values, the correlator output of the summing network 66 is a maximum amplitude. Lesser amplitudes are output from the network 66 depending on how close the signal components are to the values.

Because the duration of the peaks in the correlated signal is very small, less than a picosecond, it is necessary to hold the peak for a longer duration of time for subsequent processing. To perform the peak hold, the correlated signal from the system 60 is applied to a positive peak detector 72 and a negative peak detector 74. The positive peak detector 72 compares the correlated signal to a predetermined threshold to detect when a positive peak of a certain magnitude occurs in the signal, and holds the peak for a longer period of time. The negative peak detector 74 compares the correlated signal to a predetermined threshold to detect when a negative peak of a certain magnitude occurs in the signal, and holds the peak for a longer period of time.

The peak detectors 72 and 74 can be any peak detector suitable for the purposes described herein. In FIG. 2, the peak detectors 72 and 74 are shown as a capacitor and diode circuit 76, sometimes referred to as an envelope detector. The combination of a positive peak detector and a negative peak detector is employed because there is equal significance if the signal components are exactly opposite to the correlation value sequence (−1, 1, −1, 1). So, either the positive or negative peak can be used for the error correction, and both peaks can be differentiated for offset control.

The detected peak values from the peak detectors 72 and 74 are sent to the weight computer 40. The weight computer 40 analyzes the frequency at which the peaks are received to make a determination that the signal is properly corrected. The weight computer 40 provides the weight values that are coded by the coding systems 44 and then applied to the multipliers 36. The weight computer 40 continuously changes the weight values to search for the proper peak value as the metric of distortion in the signal. The weight computer 40 can employ any of the well known algorithms for the purpose, such as tau dither algorithms, hypothesis searching algorithms, gradient searching algorithms, steepest decent algorithms, zero-forcing algorithms, etc.

Figure 4:
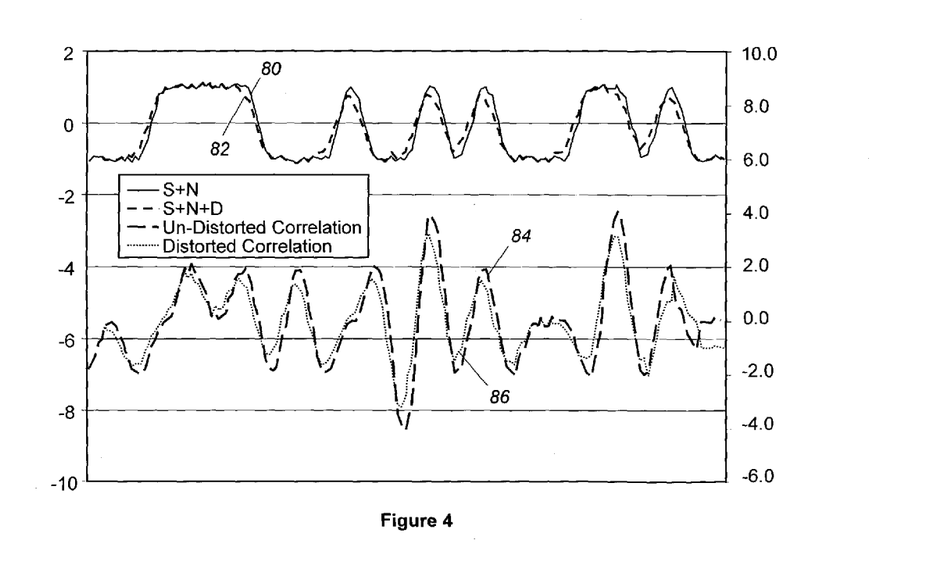
FIG. 4 is a graph showing simulation data for the correlative error detection system shown in FIG. 3.

FIG. 4 is a graph with magnitude on the vertical axis and time on the horizontal axis showing simulation data for the correlative error detector system 60 of the invention. The graph includes a graph line 80 showing signal and noise, a graph line 82 showing signal, noise and distortion, a graph line 84 showing an un-distorted correlation signal and a graph line 86 showing a distorted correlation signal.

Figure 5:
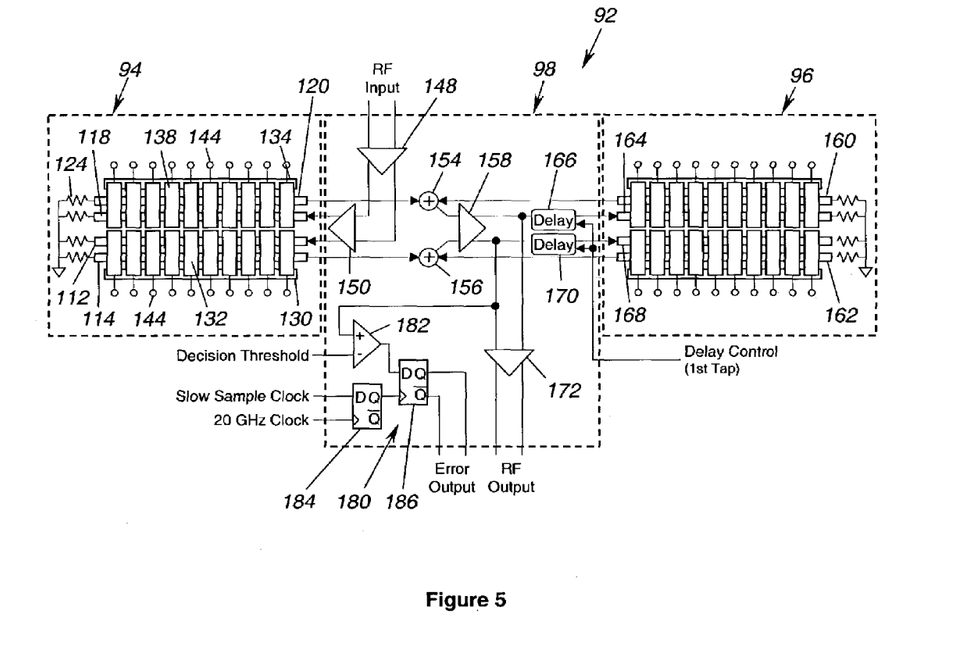
FIG. 5 is a schematic block diagram of an equalizer including a feed forward equalizer processor and a decision feedback equalizer processor both employing micro-electromechanical devices for providing weight tap controls, according to an embodiment of the present invention.

FIG. 5 is a schematic diagram of an equalizer 92 that performs the same function as the equalizer 10 discussed above, but employs micro-electromechanical (MEM) devices in the FFE and the DFE to reduce power consumption, according to an embodiment of the invention. The equalizer 92 includes an FFE processor 94, a DFE processor 96 and an adaptive weight processor 98. The FFE processor 94 and the DFE processor 96 process differential signals in this embodiment. A differential signal has two complimentary parts that are opposite in amplitude, the signal being the difference between them. As is known in the art, differential signaling is sometimes used in communications systems to provide greater noise immunity.

Figure 6:
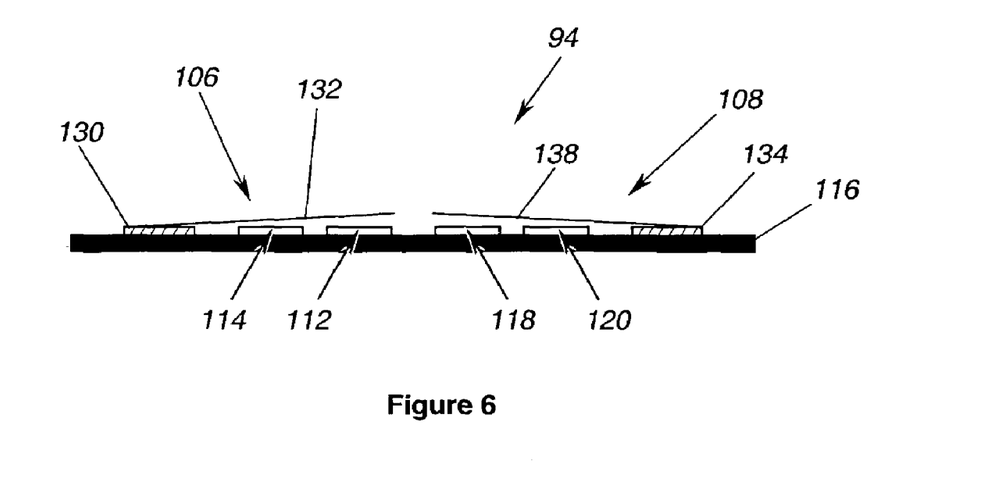
FIG. 6 is a cross-sectional view of the feed forward equalizer processor shown in FIG. 5.

FIG. 6 is a cross-sectional view of the processor 94. The processor 96 would look the same. To accommodate the differential signals, the FFE processor 94 includes a negative signal portion 106 and a positive signal portion 108. If the input signal was not differential, then only one of the portions 106 or 108 would be required. The negative portion 106 includes a forward transmission line rail 112 and a return transmission line rail 114 formed on an MEM substrate 116, where the rails 112 and 114 are parallel and spaced apart from each other, as shown. Likewise, the positive portion 108 includes a forward transmission line rail 118 and a return transmission line rail 120 also formed on the substrate 116, where the rails 118 and 120 are parallel and spaced apart from each other, as shown. Each of the rails 112, 114, 118 and 120 are electrically coupled at one end to a separate load resistor 124 that is connected to ground.

The negative portion 106 includes a cantilever stanchion rail 130 mounted along one edge of the substrate 116. A plurality of spaced apart cantilevers 132 are pivotally mounted to the cantilever stanchion rail 130 by any suitable MEM fabrication technique. The cantilevers 132 extend over the transmission line rails 112 and 114 to form a gap therebetween, as shown. Likewise, the positive portion 108 includes a cantilever stanchion rail 134 mounted along an opposite edge of the substrate 116. A plurality of cantilevers 138 are pivotally mounted to the cantilever stanchion rail 134 and extend over the transmission line rails 118 and 120 to form a gap therebetween. The transmission line rails 112 and 118 and the series of cantilevers 132 and 138 provide the required delay for the tapped delay line of the FFE processor 94.

The substrate 116 can be any suitable material for the purposes described herein, such as InP, GaAs, etc. The transmission line rails 112, 114, 118 and 120 can be any suitable metal that propagates an electrical signal therethrough, and can be formed on the substrate 116 by any suitable fabrication technique. The cantilever rails 130 and 134 can be any suitable dielectric material formed on the substrate 116, and the cantilevers 132 and 138 can be any suitable metal that flexes in response to a DC bias. The sizes of the various elements of the equalizer 92 discussed herein would be readily recognizable to those skilled in the art for a particular environment.

The distance between the particular cantilever 132 or 138 and the associated rail 112, 114, 118 or 120 determines the electrical coupling therebetween. Particularly, the narrower the gap, the more of the electrical signal is transferred from the transmission line rail 112, 114, 118 or 120 to or from the cantilever 132 or 138. The cantilevers 132 and 138 pivot on the respective cantilever stanchion rails 130 and 134. Each cantilever 132 and 138 includes a weight tap 144 electrically coupled thereto. By providing a DC bias to the tap 144, the gap between the respective cantilever 132 or 138 and the transmission line rail 112, 114, 118 or 120 can be controlled. The more bias that is applied to the cantilever 132 and 138 as to increase the electrostatic repulsion, the wider the gap becomes.

An error output signal from the adaptive weight equalizer 98 provides the bias signal to the taps 144 to provide the weight value. A distorted RF input signal is applied to sequential differential amplifiers 148 and 150 in the adaptive processor 98. The positive differential signal from the amplifier 150 is applied to the forward transmission line rail 118, and the negative differential signal from the amplifier 150 is applied to the forward transmission line rail 112. The signal propagates down the transmission line rails 112 and 118 to the load resistors 124. Each time the signal in the transmission line rail 112 and 118 travels beneath the respective cantilever 132 or 138, a portion of the signal is coupled onto the cantilever 132 or 138. The width of the gap determines how much of the signal is coupled onto the cantilever 132 or 138. Thus, a portion of the signal is transferred from the rail 118 through the particular cantilever 138 to the return transmission line rail 120, and from the rail 112 through the particular cantilever 132 to the return transmission line rail 114. Therefore, each time the return signal gets to a cantilever 132 or 138 on the return rail 114 or 120, that signal is added to the signal coupled from the forward transmission line 112 or 118 at that cantilever 132 or 138. Each cantilever 132 and 138 provides the addition of the signal to the signal traveling on the return rail 114 and 120 in the same manner as the summers 38 to provide the signal summing of equation (1). The DFE processor 96 also includes the same MEM cantilever structure as the FFE processor 94.

The positive summed signal on the return rail 120 is applied to a summer 154, and the negative summed signal on the return rail 114 is applied to a summer 156. Likewise, the positive summed signal from a positive return transmission line rail 160 of the DFE processor 96 is applied to the summer 154, and the negative summed signal from a negative return transmission line rail 162 of the DFE processor 96 is applied to the summer 156. The summers 154 and 156 sum the differential signals from the FFE processor 94 and the DFE processor 96, and apply the summed signals to a differential amplifier 158. The positive part of the differential signal from the amplifier 158 is applied to a positive forward transmission line rail 164 of the DFE 96 through a delay device 166. Likewise, the negative part of the differential signal from the amplifier 158 is applied to a negative forward transmission line rail 168 through a delay device 170. A delay control is applied to the delay devices 166 and 170 to set the amount of delay, as would be understood by those skilled in the art. Thus, the DFE processor 96 provides the feedback. Additionally, the positive and negative parts of the differential signal from the amplifier 158 are applied to an output differential amplifier 172 to provide the reconstructed signal for subsequent processing.

The equalizer 92 includes an error detection circuit 180 that is an alternative to the correlative error detection system 60, discussed above. For very high data rates, the error detection circuit 180 can be replaced with the system 60. A decision threshold signal and the negative part of the differential output signal from the amplifier 158 are applied to a comparator 182 to determine whether the signal is above or below a threshold, at a particular instant in time, to determine if the eye is open, as discussed above. If the output signal from the amplifier 158 is above the threshold, a digital high signal is provided from the comparator 182 as a D input to a latch 186. A clock signal from a latch 184 provides the clock input to the latch 186 at a lower frequency. When the input to the latch 186 is high, it is transferred to the output Q at the next clock signal. A compliment of the output Q is provided at Q-bar so that high signals are provided for when the output signal is both above and below the threshold. The error output signal is then sent to a weight computer (not shown) that can be the weight computer 40 discussed above, where the weight computer sets the bias signal applied to the taps 144 in both the FFE processor 94 and the DFE processor 96 to perform the distortion correction as discussed herein.

The equalizers 10 and 92 can be used in various devices in fiber optic and RF communications systems. For example, the equalizers can be employed in, but not limited to, sliding window correlators used in cable and RF modems and codecs; general filtering processors such as high pass, low pass, band pass and notch filters; and matched filters used in data recognizers.

Specialized circuit element layouts on an integrated circuit board are typically necessary for high frequency electronic systems, such as the equalizers 10 and 92 discussed above. Because the frequencies are very high in these applications, the size of the circuit elements can be made very small, and can be provided in a compact design on an integrated circuit board. However, when metallized traces and the like are provided on such a compact circuit board, the element interconnects cause serious problems with parasitic inductances and capacitances and cross-talk that significantly degrades the performance of the device. Therefore, specialized designs are required for such compact circuits operating at extremely high frequencies.

Figure 7:
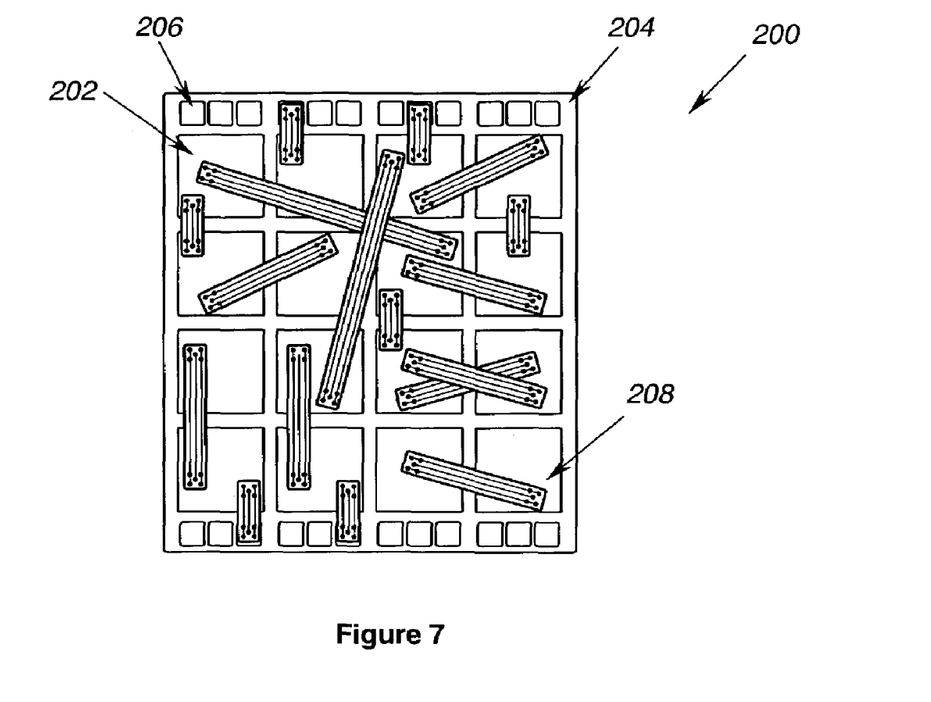
FIG. 7 is a top view of a circuit array configuration employing a cell architecture, according to an embodiment of the present invention.

FIG. 7 is a top view of a configurable circuit array 200, according to an embodiment of the present invention. The circuit array 200 includes a circuit matrix of element cells 202, where each cell 202 includes interconnected analog and/or digital circuit elements and devices, such as amplifiers, multipliers, summers, differential comparators, detectors, passive and active filters, digital-to-analog and analog-to-digital converters, mixers, latches, etc. The various circuit elements configured in the cells 202 are patterned on an integrated circuit or semiconductor substrate 204 in this matrix design. A series of ribbon or wire bonding metal pads 206 are provided along opposing edges of the substrate 204 that provide a location where the input and output signals of the various elements in the cells 202 are transferred on and off chip.

Figure 8:
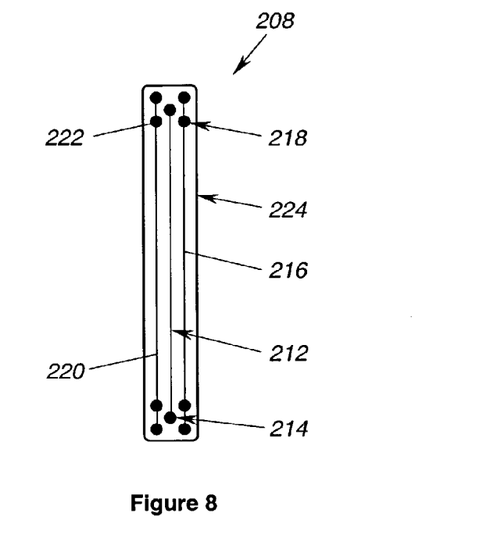
FIG. 8 is printed tape coaxial transmission line employed in the circuit array configuration shown in FIG. 7.

According to the invention, shielded coaxial transmission lines 208 are used to interconnect the various circuit elements in the different cells 202 to each other and to the bonding pads 206. FIG. 8 is a plan view of one of the transmission lines 208 separated from the array 200. The transmission line 208 includes a center conductor 212 that is coupled to solder bumps 214 at opposite ends. The center conductor 212 is shielded by a first shield conductor 216 that is coupled to solder bumps 218 at opposite ends, and a second shield conductor 220 coupled to solder bumps 222 at opposite ends. The center conductor 212 and the shield conductors 216 and 220 are encased in a dielectric medium 224 that keeps them electrically isolated from each other. Two center conductors can be provided for differential signals.

Figure 9:
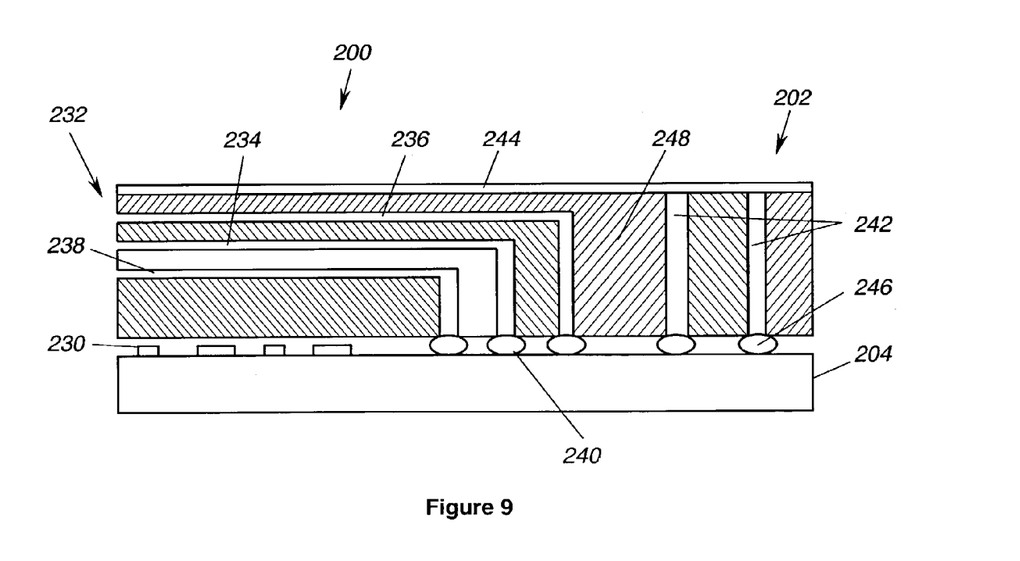
FIG. 9 is a cross-sectional view of a portion of the circuit array configuration shown in FIG. 7.

FIG. 9 is a broken-away, cross-sectional view of the configurable array 200 showing the substrate 204 and a portion of one of the cells 202. A plurality of active circuit elements 230 are formed on the substrate 204 in the cell 202. A transmission line 232 is connected to electrical contacts in the cell 202 to provide the various electrical connections. The transmission line 232 includes a center conductor 234, a top shield layer 236 and a bottom shield layer 238. The top and bottom shield layers 236 and 238 and the center conductor 234 are connected to solder bumps 240 on the substrate 204. The center conductor 234 and the shield layers 236 and 238 are formed in a dielectric medium 248 so that they extend away from the substrate 204 a certain distance& before they extend horizontal to the substrate 204. This prevents the radiation from the active elements from affecting the signal on the conductor 234. Via conductors 242 are coupled to a top shield layer 244 and to a solder bump 246 on the substrate 204.

The array 200 employing the transmission lines 208 has particular application for the equalizers 10 and 92 discussed above. The transmission lines 208 provide the desired delays and the necessary shielding between the circuit elements without appreciable losses or distortion. The various parameters of the transmission lines 208, i.e., length, width, conductor size, etc., are tightly controlled to provide the desired performance. Further, the transmission lines 208 are terminated into their characteristic impedance. Also, the transmission lines 208 are designed to have matched capacitance and inductance to have only a real component. The array 200 has other circuit applications beyond equalizers, including, but not limited to, sliding window correlators, high pass, low pass, band pass, notch and matched filters, serial-to-parallel and parallel-to-serial converters, sample and holds, multiplexers, clock and date recovery, etc.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. An equalizer for correcting distortions in a distorted signal, said equalizer comprising:
an input transmission line responsive to the distorted signal;
an output transmission line coupled to the input transmission line, said output transmission line providing a corrected signal; and
a plurality of spaced apart cantilevers positioned adjacent to and spaced from the input transmission line and the output transmission line, each cantilever being responsive to a bias voltage, said bias voltage moving the cantilever to adjust a gap between the cantilever and the input and output transmission lines, wherein the movable cantilevers provide a weighting function for adjusting the amount of the signal that is transferred from the input transmission line to the output transmission line through the cantilevers.

2. The equalizer according to claim 1 wherein the plurality of cantilevers are flexibly mounted to a common stanchion running parallel to the input and output transmission lines.

3. The equalizer according to claim 2 wherein the cantilever stanchion, the input transmission line and the output transmission line are all mounted on a common semiconductor substrate.

4. The equalizer according to claim 1 wherein the bias voltage applied to the cantilevers is generated by an error detection system and a weight computer.

5. The equalizer according to claim 4 wherein the error detection system is a correlative error detection system operating as a matched filter, said error detection system providing a signal peak if a sequence of bits in the corrected signal matches a predetermined sequence of filter values.

6. The equalizer according to claim 1 wherein the equalizer is one of a feed forward equalizer or a decision feedback equalizer.

7. The equalizer according to claim 1 wherein the equalizer is part of an optical communications system and the distorted signal is an optical signal.

8. An equalizer for removing distortions in a distorted differential signal, said differential signal including a positive part and a negative part, said equalizer comprising:
   a substrate;
   a positive forward transmission line rail mounted on the substrate and being responsive to the positive part of the differential signal;
   a negative forward transmission line rail mounted on the substrate and being responsive to the negative part of the differential signal;
   a positive return transmission line rail mounted on the substrate adjacent and parallel to the positive forward transmission line rail;
   a negative return transmission line rail mounted on the substrate adjacent and parallel to the negative forward transmission line rail;
   a first cantilever stanchion mounted to the substrate adjacent to the positive forward transmission line rail and the positive return transmission line rail;
   a second cantilever stanchion mounted to the substrate adjacent to the negative forward transmission line rail and the negative return transmission line rail;
   a plurality of positive signal cantilevers flexibly mounted to the first cantilever stanchion spaced apart from each other, said plurality of positive cantilevers defining a gap between the positive cantilevers and the positive forward transmission line rail and the positive return transmission line rail; and
   a plurality of negative signal cantilevers flexibly mounted to the second cantilever stanchion spaced apart from each other, said plurality of negative cantilevers defining a gap between the negative cantilevers and the negative forward transmission line rail and the negative return transmission line rail.

9. The equalizer according to claim 8 wherein the positive forward transmission line rail, the negative forward transmission line rail, the positive return transmission line rail, the negative return transmission line rail, the first cantilever stanchion and the second cantilever stanchion are all parallel to each other.

10. The equalizer according to claim 8 wherein each cantilever includes a signal weight tap, each signal weight tap being responsive to a DC bias voltage to control the gap between the cantilever and the transmission line rails.

11. The equalizer according to claim 10 wherein the bias voltage is generated by an adaptive weight processor.

12. The equalizer according to claim 11 wherein the adaptive weight processor includes an error correction system and a weight computer.

13. The equalizer according to claim 8 wherein the equalizer is one of a feed forward equalizer or a decision feedback equalizer.

14. An equalizer for correcting distortions in a distorted differential signal, said differential signal including a positive part and a negative part, said equalizer comprising:
   a feed forward equalizer processor, said feed forward equalizer processor including a first substrate, a first positive forward transmission line rail mounted on the first substrate and being responsive to the positive part of the differential signal, a first negative forward transmission line rail mounted on the first substrate and being responsive to the negative part of the differential signal, a first positive return transmission line rail mounted on the first substrate adjacent and parallel to the first positive forward transmission line rail, a first negative return transmission line rail mounted on the first substrate adjacent and parallel to the first negative forward transmission line rail, a first cantilever stanchion mounted to the first substrate adjacent and parallel to the first positive forward transmission line rail and the first positive return transmission line rail, a second cantilever stanchion mounted to the first substrate adjacent and parallel to the first negative forward transmission line rail and the first negative return transmission line rail, a plurality of first positive signal cantilevers flexibly mounted to the first cantilever stanchion and being spaced apart from each other, said plurality of first positive cantilevers defining a gap between the first positive cantilevers and the first positive forward transmission line rail and the first positive return transmission line rail, and a plurality of first negative signal cantilevers flexibly mounted to the second cantilever stanchion and being spaced apart from each other, said plurality of first negative cantilevers defining a gap between the first negative cantilevers and the first negative forward transmission line rail and the first negative return transmission line rail; and
   a decision feedback equalizer processor, said decision feedback equalizer processor including a second substrate, a second positive forward transmission line rail mounted on the second substrate and being responsive to a first summed signal, a second negative forward transmission line rail mounted on the second substrate and being responsive to a second summed signal, a second positive return transmission line rail mounted on the second substrate adjacent and parallel to the second positive forward transmission line rail, a second negative return transmission line rail mounted on the second substrate adjacent and parallel to the second negative forward transmission line rail, a third cantilever stanchion mounted to the second substrate adjacent and parallel to the second positive forward transmission line rail and the second positive return transmission line rail, a fourth cantilever stanchion mounted to the second substrate adjacent and parallel to the second negative forward transmission line rail and the second negative return transmission line rail, a plurality of second positive signal cantilevers flexibly mounted to the third cantilever stanchion and being spaced apart from each other, said plurality of second positive cantilevers defining a gap between the second positive cantilevers and the second positive forward transmission line rail and the second positive return transmission line rail, and a plurality of second negative signal cantilevers flexibly mounted to the fourth cantilever stanchion and being spaced apart from each other, said plurality of second negative cantilevers defining a gap between the second negative cantilevers and the second negative forward transmission line rail and the second negative return transmission line rail, wherein the first summed signal is the sum of a corrected signal from the first positive return transmission line rail and a corrected signal from the second positive return transmission line rail and the second summed signal is the sum of a corrected signal from the first negative return transmission line rail and a corrected signal from the second negative return transmission line rail, and wherein each cantilever includes a signal weight tap, said signal weight tap being responsive to a DC bias voltage to control the gap between the cantilever and the transmission line rails.

15. The equalizer according to claim 14 wherein the first summed signal is sent through a first delay device before it reaches the second positive forward transmission line and the second summed signal is sent through a second delay device before it reaches the second negative forward transmission line.

16. The equalizer according to claim 14 wherein the first summed signal and the second summed signal are two parts of a corrected differential signal.

17. An equalizer for correcting distortions in a distorted signal, said equalizer comprising:
   a tapped delay line including a plurality of spaced apart micro-electromechanical devices and a pair of adjacent transmission lines,
   each micro-electromechanical device including a cantilever member spaced from the transmission lines,
   wherein one of the transmission lines is responsive to the distorted signal; and
   wherein the cantilever members couple the distorted signal onto the other transmission line.

18. The equalizer according to claim 17 wherein each cantilever member includes a signal weight tap, each signal weight tap being responsive to a DC bias voltage to control a gap between the cantilever member and the transmission lines.

19. The equalizer according to claim 17 further comprising a cantilever stanchion, each of the cantilever members being flexibly mounted to the cantilever stanchion.

20. A method of correcting distortions in a distorted signal, comprising:
   propagating the distorted signal down an input transmission line;
   coupling the signal on the input transmission line into a plurality of spaced apart cantilevers, said cantilevers being positioned adjacent to and spaced from the input transmission line;
   applying a bias voltage to the cantilevers to adjust a gap between the cantilevers and the input transmission line; and
   coupling the signal on the cantilevers onto an output transmission line, wherein the bias voltages applied to the cantilevers provide a weighting function for controlling the amount of the signal that is transferred from the input transmission line to the output transmission line through the cantilevers.

21. The method according to claim 20 wherein coupling the signal on the cantilevers onto an output transmission line includes summing the signals on each cantilever to provide a corrected signal.

22. The method according to claim 21 further comprising applying the corrected signal to an error detection system to determine whether the corrected signal is distorted and providing an error signal indicative of the amount that the corrected signal is distorted.

23. The method according to claim 22 further comprising applying the error signal to a weight computer for changing the bias voltages applied to the cantilevers to correct the distortions in the corrected signal.

* * * * *